(12) United States Patent
Miyamoto et al.

(10) Patent No.: US 8,735,886 B2
(45) Date of Patent: May 27, 2014

(54) IMAGE DETECTOR

(71) Applicants: Kenichi Miyamoto, Kumamoto (JP); Masami Hayashi, Kumamoto (JP); Hiromasa Morita, Tokyo (JP); Isao Nojiri, Tokyo (JP)

(72) Inventors: Kenichi Miyamoto, Kumamoto (JP); Masami Hayashi, Kumamoto (JP); Hiromasa Morita, Tokyo (JP); Isao Nojiri, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/691,383

(22) Filed: Nov. 30, 2012

(65) Prior Publication Data

US 2013/0140568 A1    Jun. 6, 2013

(30) Foreign Application Priority Data

Dec. 1, 2011   (JP) ................................. 2011-263805

(51) Int. Cl.
    *H01L 31/0248*    (2006.01)
(52) U.S. Cl.
    USPC .................... 257/53; 257/59; 257/72; 257/88

(58) Field of Classification Search
    USPC ......................................... 257/43, 53, E29.273
    See application file for complete search history.

(56) References Cited

U.S. PATENT DOCUMENTS

| 6,384,393 B2 | 5/2002 | Takami et al. |
| 2009/0052624 A1 | 2/2009 | Mochizuki et al. |

FOREIGN PATENT DOCUMENTS

| EP | 0126417 A2 | 11/1984 |
| JP | 59-211262 A | 11/1984 |
| JP | 10-341013 A | 12/1998 |
| JP | 2007-049124 A | 2/2007 |
| JP | 2008-251609 A | 10/2008 |
| JP | 2011-058831 A | 3/2011 |

*Primary Examiner* — Mamadou Diallo
(74) *Attorney, Agent, or Firm* — Studebaker & Brackett PC

(57) ABSTRACT

An image detector comprises: an active matrix-type TFT array substrate having a pixel area, in which photoelectric conversion elements and thin film transistors are arranged in a matrix shape, a data line, and a bias line; a conversion layer, which is arranged on the TFT array substrate and converts radiation into light; and a conductive cover, which covers the conversion layer, wherein the conductive cover is adhered in an adhesion area in an upper layer than an area, in which at least one of the data line and the bias line extend from the pixel area to each of terminals, and wherein inorganic insulation films configured by at least two layers are formed between the at least one of the data line and the bias line and the adhesion area.

2 Claims, 7 Drawing Sheets

IMAGE DETECTOR

CROSS-REFERENCE TO RELATED APPLICATION

This application claims priority from Japanese Patent Application No. 2011-263805 filed on Dec. 1, 2011, the entire subject matter of which is incorporated herein by reference.

TECHNICAL FIELD

This disclosure relates to an image detector such as a radiation-light conversion apparatus and a radiographic imaging apparatus having the same.

BACKGROUND

In many cases, according to the need to correctly detect an abnormal part of a patient, an X-ray inspection machine that is used in medical fields converts an X-ray into visible light and the like by a fluorescent plate and sensitizes a film that is closely contacted to the fluorescent plate. According to a method adopted in the X-ray inspection machine, there is no problem as regards a resolution of an image at a practical level. However, it takes time from measurement to diagnosis. Also, when specifying a measuring place, it mostly depends on a skill and a sense of an X-ray technician.

In recent years, a large scale area sensor made by amorphous silicon and the like has been developed and then increase the reliability thereof. With considering the merit of using the amorphous silicon and the easy large-sizing, the developments for performing the X-ray inspection in real time and using an emphasis image to thus increase an efficiency of abnormal diagnosis for a patient have been actively made.

An array substrate of the large scale area sensor that is used in a radiographic imaging apparatus has a configuration where pixels having switching elements such as thin film transistors and photoelectric conversion elements such as photodiodes are arranged two-dimensionally. In addition to this, the array substrate generally has gate lines and source lines that supply a voltage to the switching elements and bias lines to read photovoltaic power of the photoelectric conversion elements. The switching element is provided at an intersection point of the gate line and the source line and the bias line is provided to intersect the pixel that is defined by the intersection of the gate line and the source line (refer to JP-A-2008-251609 and JP-A-2007-049124).

In general, when detecting an X-ray image by the photoelectric conversion elements using amorphous silicon as photodiodes, an X-ray-visible light conversion apparatus that converts radiation, particular X-ray into visible light is required. In the medical fields, a large-scaled apparatus is required which can support an X-ray inspection machine for chest imaging and then it is known that a configuration, in which a fluorescent plate (made of fluorescent powders and having a plate shape), which has been conventionally used for film sensitization and is easily obtained practically, is adhered to an array substrate of a large scale area sensor by using an adhesive and the like. In another structure, a scintillator made of a CsI (cesium iodide) film may be used. In the following description, the fluorescent plate and the scintillator will be described without particular distinction (refer to JP-A-59-211262).

Also, in order to suppress deterioration of the fluorescent plate due to mixing of radiation noise or water into a sensor part, a conductive cover is provided which covers an array substrate of a large scale area sensor and a fluorescent body (refer to JP-A-10-341013 (FIGS. 20 and 21)).

As the conductive cover, a thin metal plate, for example aluminum thin plate is used. Also, when the fluorescent plate includes a corrosion-prone material such as CsI, the conductive cover may be corroded if the conductive cover is directly contacted to the fluorescent plate. Therefore, the conductive cover is attached to contact a periphery part of the array substrate while covering the fluorescent plate without contacting the fluorescent plate.

However, when attaching the conductive cover to the array substrate, a pressure is applied to the periphery part of the array substrate. Thus, a short may be caused between a wiring that is arranged below an insulation film in the periphery part of the array substrate and the conductive cover (refer to JP-A-2011-58831 (page 4)).

SUMMARY

Here, a structure of the array substrate shown in JP-A-2008-251609 will be described briefly. A bottom gate-type thin film transistor is formed on a substrate, a photodiode is formed via an insulation film of an upper layer, and then a data line and a bias line are formed via the insulation film of an upper layer. Although a device is mostly completed by these processes, a whole surface is generally covered by an inorganic insulation film such as SiN or SiO2 film or organic insulation film made of a resin and the like, as a protective layer. After that, a step portion is formed, and a scintillator is formed by film formation of CsI and the like.

In case that the thin film transistor is a bottom gate type, the gate line is formed at the lowermost layer. Therefore, since a plurality of insulation layers is formed above the gate line in the periphery part of the array substrate, the short with the gate line is difficult to occur even when the conductive cover is pressed.

In the meantime, for the bias line or data line, since the inorganic insulation layer covering the same is generally a mono layer, the short defect occurs relatively easily when the conductive cover is pressed. Although it is known that a stacked layer of the inorganic insulation film and the organic resin insulation film is used as an insulation layer on the wiring, the organic resin insulation film is flexible and has very weak durability against the pressing of the conductive cover. Thus, the same problem as a configuration where only the inorganic insulation layer of a mono layer is provided occurs.

When a thickness of the insulation layer is increased so as to solve the above problem, a manufacturing cost is increased and the productivity is decreased, and the problems of stress and bending of the array substrate may also occur. Also, as long as the inorganic insulation film configures a mono layer, a yield lowering is caused according to the short with the conductive cover via a film deficiency caused in the inorganic insulation film due to foreign materials.

In any case, when the above problem occurs only at one place, the conductive cover capacitively couples the corresponding wiring and the adjacent wiring therebetween, thereby causing a display defect. Also, when the above problem occurs at a plurality of places, the wirings are shorted each other via the conductive cover, so that a degree of the display defect gets more worse.

In view of the above, an image detector of this disclosure, an image detector comprises: an active matrix-type TFT array substrate having a pixel area, in which photoelectric conversion elements and thin film transistors are arranged in a matrix shape, a data line, and a bias line; a conversion layer, which is arranged on the TFT array substrate and converts radiation into light; and a conductive cover, which covers the conversion layer, wherein the thin film transistor comprises: a plurality of gate lines having a gate electrode; a semiconductor layer provided to the gate electrode via a gate insulation film; and a source electrode and a drain electrode connected to the semiconductor layer, wherein the photoelectric conversion element, which connects with the drain electrode via a first contact hole opened through a first passivation film provided above the thin film transistor, wherein the data line is formed on a second passivation film provided above the photoelectric conversion element and connects with the source electrode via a second contact hole opened through the first passivation film and the second passivation film, wherein the bias line is formed on the second passivation film provided above the photoelectric conversion element and connects with the photoelectric conversion element via a third contact hole opened through the second passivation film, wherein the TFT array substrate comprises: a gate terminal to input a driving signal to the gate electrode from an outside; a data terminal to read out charges detected in the photoelectric conversion element to the outside via the data line; and a bias terminal to input an applied voltage from the outside to the photoelectric conversion element via the bias line, wherein the conductive cover is adhered in an adhesion area in an upper layer than an area, in which at least one of the data line and the bias line extend from the pixel area to each of the terminals, and wherein inorganic insulation films configured by at least two layers are formed between the at least one of the data line and the bias line and the adhesion area.

Accordingly, it is possible to suppress at least a short between the wiring positioned below the insulation layer in the peripheral part of the array substrate and the conductive cover for suppressing the deterioration of the fluorescent body.

BRIEF DESCRIPTION OF THE DRAWINGS

The foregoing and additional features and characteristics of this disclosure will become more apparent from the following detailed descriptions considered with the reference to the accompanying drawings, wherein.

DETAILED DESCRIPTION

First Illustrative Embodiment

Figure 1:
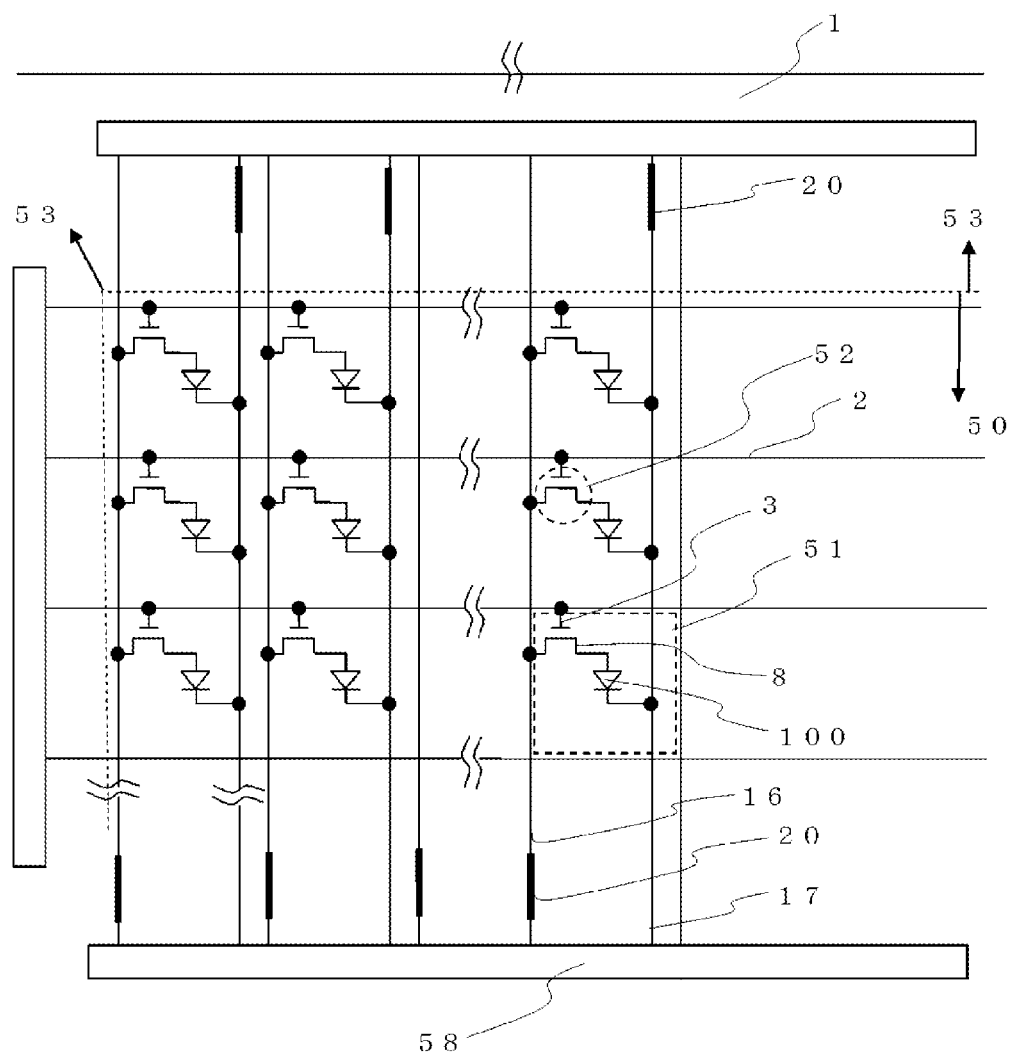
FIG. 1 is a plan view illustrating an array substrate of an image detector according to a first illustrative embodiment of this disclosure.

Hereinafter, illustrative embodiments of this disclosure will be described. FIG. 1 is a plan view illustrating an array substrate of an image detector according to a first illustrative embodiment of this disclosure.

An array substrate has a pixel part 50, which is a pixel area in which a plurality of pixels 51 is arranged side by side, and a periphery part 53 around the pixel part 50, which includes terminals 58, an area (not shown) in which a conductive cover are adhered and wirings extending over the terminals 58 and the pixel part 50. In the pixel part 50, a plurality of gate lines 2 and a plurality of data lines 16 intersecting with the gate lines 2 are formed. The pixels 51 are defined by areas that are partitioned by the intersection of the gate lines 2 and the data lines 16, and have a thin film transistor 52 being a switching device and a photoelectric conversion element 100 connected to the thin film transistor such as photodiode, respectively.

A bias line 17 is connected to a side of the photoelectric conversion element 100 of each pixel, which is an opposite side to a side connecting with the thin film transistor 52. The bias line 17 extends in parallel with the data line 16 while connecting the photoelectric conversion elements 100 of the respective pixels along the data line 16. The bias line 17, the data line 16 and the gate line 2 extend from the pixel part 50 to the periphery part 53 and are connected to the terminals. Although not shown, the respective terminals include a gate terminal that inputs a driving signal to the gate line 2 from the outside, a data terminal that reads out charges detected in the photoelectric conversion element 100 to the outside via the data line 16 and a bias terminal that inputs an applied voltage from the outside to the photoelectric conversion element 100 via the bias line 17.

Figure 2:
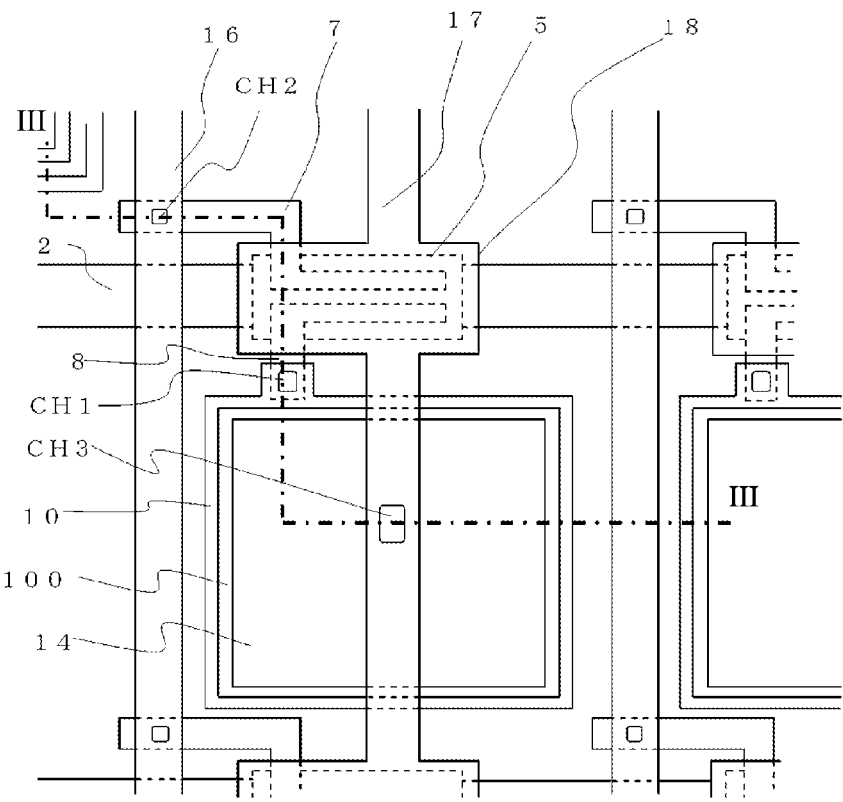
FIG. 2 is a plan view illustrating a pixel part of the array substrate of the image detector according to the first illustrative embodiment of this disclosure.
Figure 3:
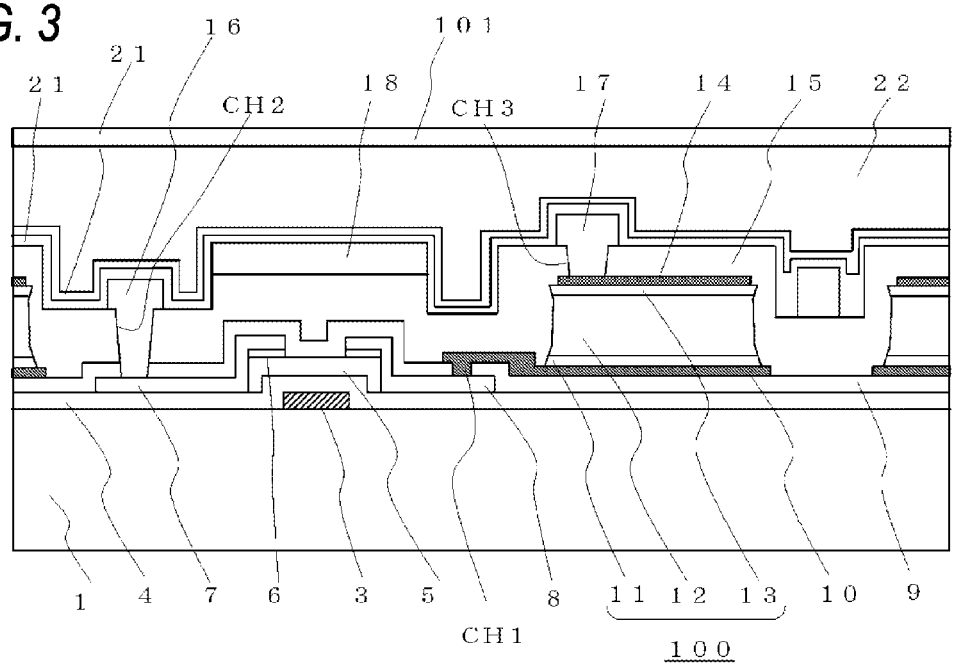
FIG. 3 is a sectional view illustrating the pixel part of the array substrate, which is taken along a line III-III of FIG. 2.

FIG. 2 is a plan view illustrating the pixel part of the array substrate of the image detector according to the first illustrative embodiment of this disclosure. FIG. 3 is a sectional view taken along a line III-III of FIG. 2. A structure of the pixel part of the array substrate of the image detector according to the first illustrative embodiment of this disclosure is described with reference to FIGS. 2 and 3.

A gate electrode 3 is formed on an insulation substrate 1 such as glass substrate by a metal having a low-resistance metal material such as aluminum (Al) as a main component. A gate insulation film 4 is formed to cover the gate electrode 3. An island-shaped semiconductor film 5 is provided above the gate electrode 3 via the gate insulation film 4.

A source electrode 7 and a drain electrode 8 are provided to connect with the semiconductor film 5 via a semiconductor film 6 having conductive impurities doped therein. An interlayer insulation film 9 that is a first passivation film is formed to cover the source electrode 7, the drain electrode 8 and the semiconductor film 5. A lower electrode 10 is formed which connects with the drain electrode 8 via a first contact hole CH1 opened through the interlayer insulation film 8.

A photodiode 100 that is a photoelectric conversion element is stacked on the lower electrode 10. The photodiode 100 is configured by an amorphous silicon film 11 having n-type impurities such as phosphor (P) doped therein, an intrinsic amorphous silicon film 12 and an amorphous silicon film 13 having p-type impurities such as boron (B) doped therein, which are sequentially stacked from the lower.

A transparent electrode 14 is formed on the photodiode 100. Via a third contact hole CH3 opened through an interlayer insulation film 15 that is a second passivation film formed to cover the photodiode 100 and the transparent electrode 14, the transparent electrode 14 connects with the bias line 17 that is formed on the interlayer insulation film 15.

The data line 16 and a light shield film 18 are formed at the same layer as the bias line 17. The data line 16 connects with the source electrode 7 via a second contact hole CH2 opened through the interlayer insulation film 9 and the interlayer insulation film 15. The light shield film 18 formed at the same layer as the bias line 17 is positioned on the thin film transistor 52 to suppress light originating from a surface from being incident onto the semiconductor film 5.

A planarization film 22 is formed on an upper layer of a stacked film of an interlayer insulation film 21 being a third passivation film formed to cover the bias line 17, the data line 16 and the light shield film 18. A conversion layer 101 that converts radiation into light is formed on the planarization film 22 that is the uppermost layer of the array substrate. The conversion layer 101 is a fluorescent plate including CsI, for example, and has a function of converting an X-ray into fluorescence. Also, a silicon oxide film or silicon nitride film is used as the passivation film, and an organic resin such as polyimide, acryl and the like may be used as the planarization film.

Figure 4:
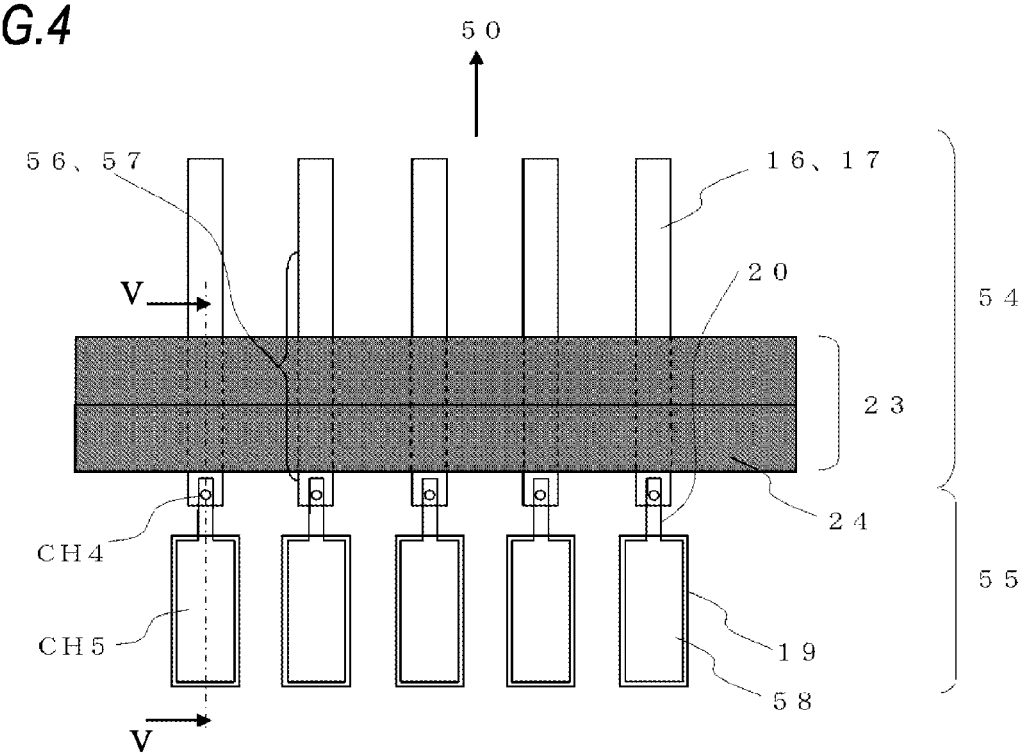
FIG. 4 is an enlarged plan view illustrating a periphery part of the array substrate of the image detector according to the first illustrative embodiment of this disclosure.
Figure 5:
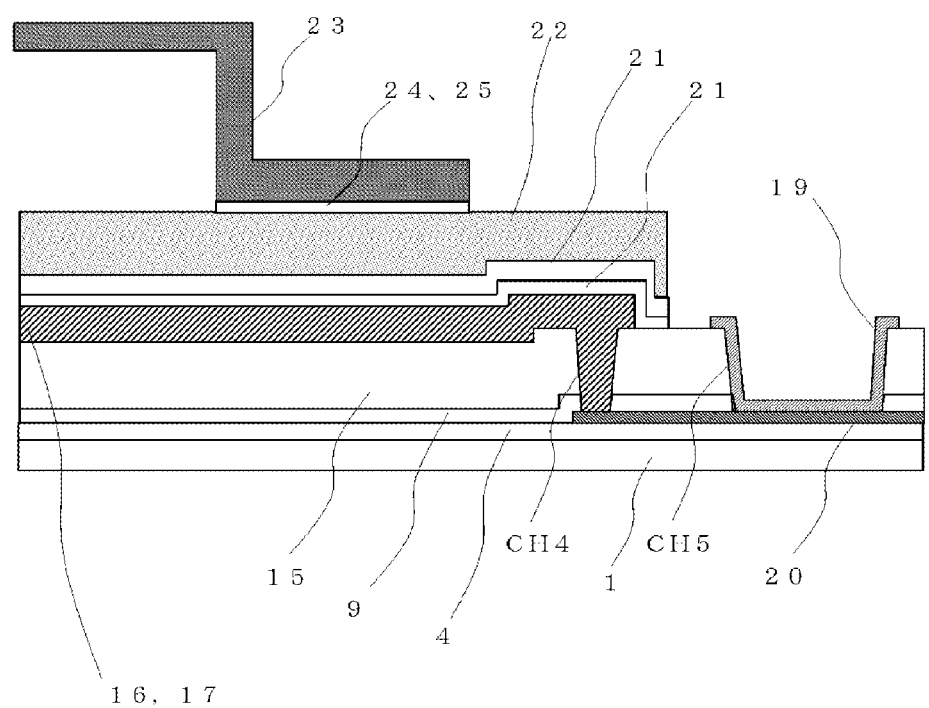
FIG. 5 is a sectional view illustrating the periphery part of the array substrate, which is taken along a line V-V of FIG. 4.

Subsequently, FIG. 4 is a plan view illustrating a periphery part of the array substrate of the image detector according to the first illustrative embodiment of this disclosure. FIG. 5 is a sectional view taken along a line V-V of FIG. 4.

The peripheral part 53 of the array substrate is configured by an external wiring area 54, a terminal formation area 55 and the like. In the external wiring area 54, an external data line 56 and an external bias line 57 are formed of a material of the same layer as the data line 16 and the bias line 17 on the interlayer insulation film 15 that is formed on the insulation substrate 1 such as glass substrate. In the following description, unless otherwise noted, the external data line 56 indicates a portion of the data line 16 or a wiring electrically connected to the data line 16, except for the pixel part 50 of the array substrate. Therefore, the external data line 56 is a part of the data line 16 or a wiring electrically connected to the data line 16. This is the same for the external bias line 57.

An interlayer insulation film 21 is stacked on the upper layer of the external data line and an external bias line. A planarization film 22 is formed on the interlayer insulation film 21. The stacked interlayer insulation film 21 may be formed by separately forming two SiN films or may be a stacked film of a SiN film and a SiO2 film.

A conductive cover 23 is fixed on the planarization film 22 by an adhesive 25 in the external wiring area. Here, a place at which the conductive cover 23 is adhered is referred to as an adhesion area 24. In the terminal formation area 55, the gate insulation film 4 is formed on the insulation substrate 1 such as glass substrate and a terminal extracting line 20 is formed thereon. In the meantime, the terminal extracting line 20 corresponds to a wiring of the external data line 56 electrically connecting with the data line 16. The external bias line is also the same. The interlayer insulation film 9 and the interlayer insulation film 15 are formed to cover the terminal extracting line 20.

The terminal extracting line 20 is electrically connected at a pixel-side end portion thereof with the external data line or external bias line via a fourth contact hole CH4 opened through the interlayer insulation film 9 and the interlayer insulation film 15. Meanwhile, the terminal extracting line is electrically connected at a terminal opening thereof with a terminal pad 19 via a fifth contact hole CH5 opened through the interlayer insulation film 9 and the interlayer insulation 15.

In the meantime, the terminal pad 19 shown in FIG. 5 is formed at the inside of an opening of the interlayer insulation film 21 and planarization film 22. However, the terminal pad 19 may be formed to partially cover the interlayer insulation film 19 and planarization film 22.

Also, the terminal extracting line 20 is formed as the wiring on the gate insulation film 4. However, the terminal extracting line 20 may be formed using a wiring on the insulation substrate 1 or interlayer insulation film 9 and may be further formed of a wiring material of the same layer as the data line 16 and bias line 17 without the conversion via the contact hole CH4.

According to the first illustrative embodiment, the inorganic insulation films of at least two layers are formed on the upper layer of the at least one of the data line and bias line in the adhesion area on which the conductive cover abuts. Therefore, even if a film deficiency is caused in the one inorganic insulation film, the short with the wirings is difficult to occur even when the conductive cover is pressed.

Second Illustrative Embodiment

Figure 6:
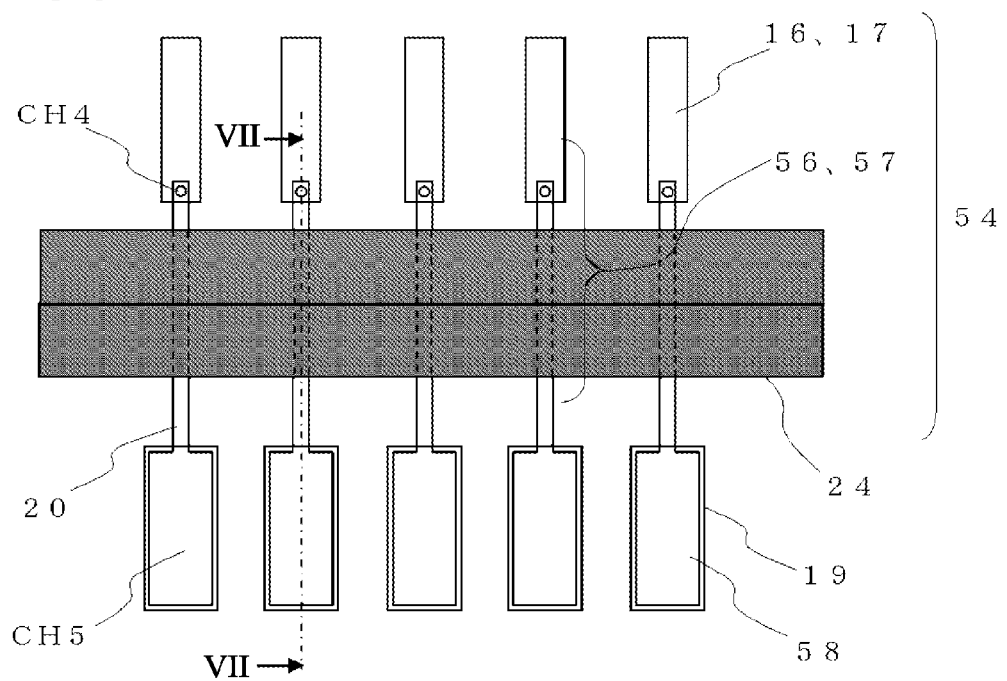
FIG. 6 is an enlarged plan view illustrating a periphery part of an array substrate of an image detector according to a second illustrative embodiment of this disclosure.
Figure 7:
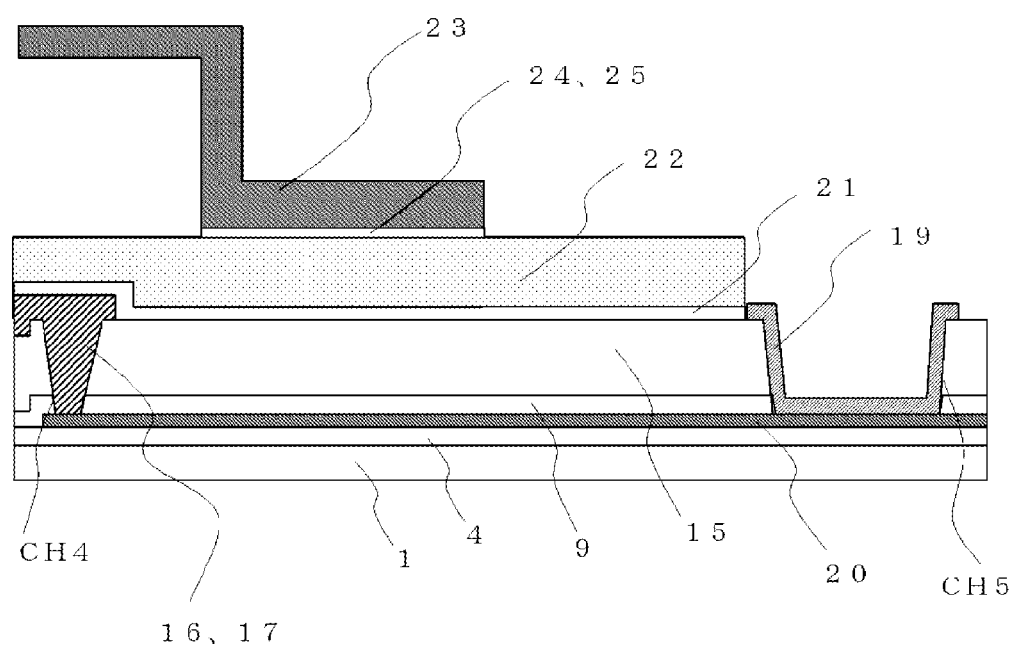
FIG. 7 is a sectional view illustrating the periphery part of the array substrate, which is taken along a line VII-VII of FIG. 6.

FIG. 6 is a plan view illustrating a periphery part of an array substrate of an image detector according to a second illustrative embodiment of this disclosure. FIG. 7 is a sectional view taken along a line VII-VII of FIG. 6. The second illustrative embodiment is different from the first illustrative embodiment, in that the external data line 56 and the external bias line 56 in the external wiring area 54 are converted into the terminal extracting line 20 from the wiring material of the same layer as the data line 16 and bias line 17 via the contact hole CH4, in an area closer to the pixel area than the conductive cover adhesion area 24. Also, the external data line in the first illustrative embodiment is an extension of the data line 16 from the pixel part 50. Compared to this, in the second illustrative embodiment, the external data line mainly corresponds to the terminal extracting line 20. The external bias line is also the same.

The terminal extracting line 20 is formed of a wiring material of the same layer as the source electrode 7 or drain electrode 8 on the gate insulation film 4 that is formed on the insulation substrate 1 such as glass substrate. Instead of the external wiring that is formed at the same layer as the data line 16 and bias line 17 positioned at the uppermost layer as the metal wirings below the adhesion area 24 of the conductive cover 23, the terminal extracting line 20 that is formed at the same layer as the source electrode 7 positioned below the external wiring is used. Thereby, the electrical short between the conductive cover 23 and the data line 16 and the like due to the pressurization of the conductive cover 23 is further difficult to occur.

Also, in the first illustrative embodiment, the interlayer insulation film 21 configures the stacked films, so that the influence of the film deficiency of the interlayer insulation film is decreased. In the second illustrative embodiment, not only the interlayer insulation film 21 but also the interlayer insulation film 15 and the interlayer insulation film 9 are interposed. Therefore, even when the interlayer insulation film 21 is not made of the stacked films, it is possible to decrease the influence resulting from the film deficiency of the respective interlayer insulation films. Also, in FIG. 6 or 7, the data line or bias line except for the terminal extracting line 20 does not exist below the adhesion area 24. Therefore, it is possible to remarkably reduce the short possibility with the conductive cover 23. However, even when the data line or bias line partially exists below the adhesion area 24, it is possible to reduce the short possibility at least at the formation place of the terminal extracting line 20.

Third Illustrative Embodiment

Figure 8:
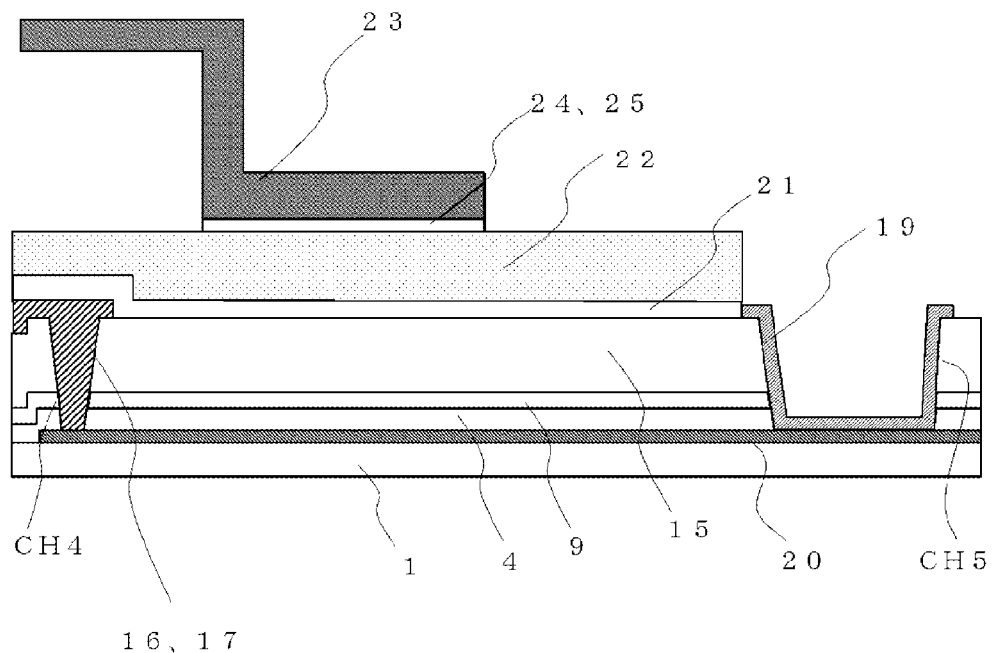
FIG. 8 is a sectional view illustrating a periphery part of an array substrate of an image detector according to a third illustrative embodiment of this disclosure.

FIG. 8 is a sectional view illustrating a periphery part of an array substrate of an image detector according to a third illustrative embodiment of this disclosure. The third illustrative embodiment is different from the second illustrative embodiment, in that the terminal extracting line 20 of the external wiring is formed of the wiring material of the same layer as the gate line.

The terminal extracting line 20 is formed on the insulation substrate 1 such as glass substrate and is formed of the wiring material of the same layer as the gate line 2. In the external wiring area 54, the gate insulation film 4, the interlayer insulation film 9 and the interlayer insulation film 15 are formed to cover the terminal extracting line 20.

The external data line 56 (or external bias line 57) formed at the same layer as the data line 16 and bias line 17 is formed on the interlayer insulation film 15. The corresponding lines and the terminal extracting line 20 are connected to each other via the contact hole CH4 opened through the gate insulation film 4, the interlayer insulation film 9 and the interlayer insulation film 15. Except for this configuration, the third illustrative embodiment is the same as the second illustrative embodiment. In FIG. 8, the contact hole CH4 is opened through the gate insulation film 4, the interlayer insulation film 9 and the interlayer insulation film 15 at once. However, a contact hole opened through the gate insulation film 4 and the interlayer insulation film 9 and a contact hole opened through the interlayer insulation film 15 may be separately provided, or positions of both contact holes may be deviated and a conductive pattern made of the same material as the lower electrode 10 may be provided as a conductive film keeping the electrical conduction between the contact holes. When the data line 15 and the gate line 2 cannot be directly connected to each other, for example when a connection resistance is high, the configuration of interposing the same material as the lower electrode 10 is effective.

In the third illustrative embodiment, in the adhesion area 24 of the conductive cover, the external wiring is also covered by the gate insulation film 4, so that the number of the insulation layers to cover is increased, compared to the second illustrative embodiment. Therefore, the short due to the pressurization of the conductive cover is further difficult to occur.

Also, when the wiring material having the lower resistance than the metal of the same layer as the source electrode is used for the gate line, it is possible to suppress the wiring resistance from increasing from the contact hole to the terminal and to improve the signal delay.

Fourth Illustrative Embodiment

Figure 9:
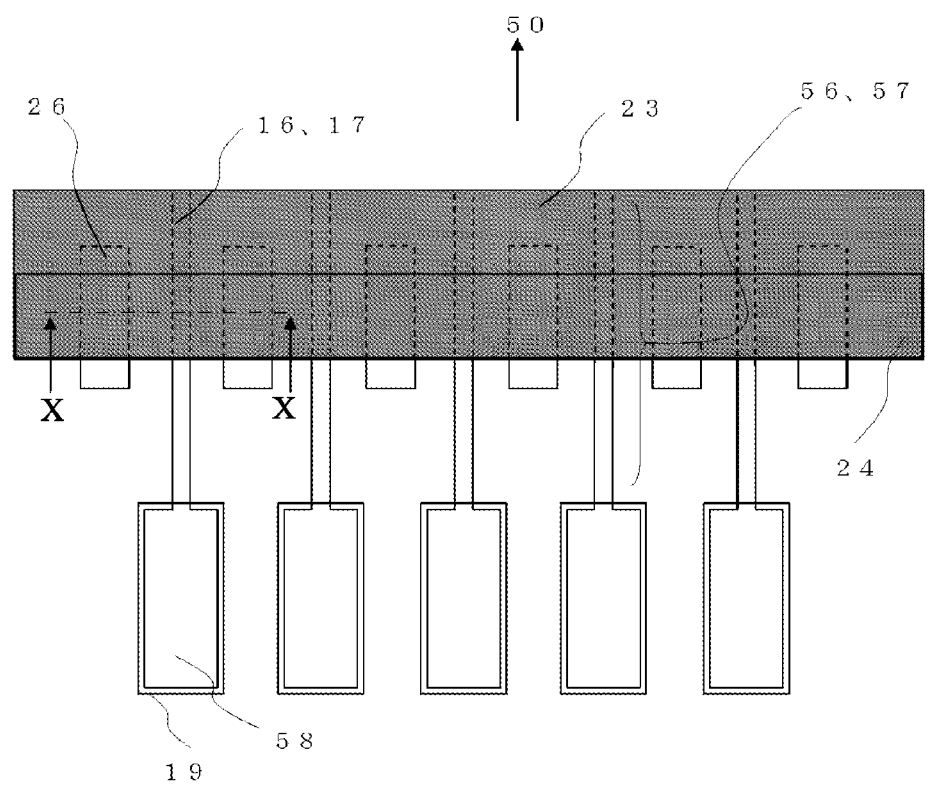
FIG. 9 is a plan view illustrating a periphery part of an array substrate of an image detector according to a fourth illustrative embodiment of this disclosure.
Figure 10:
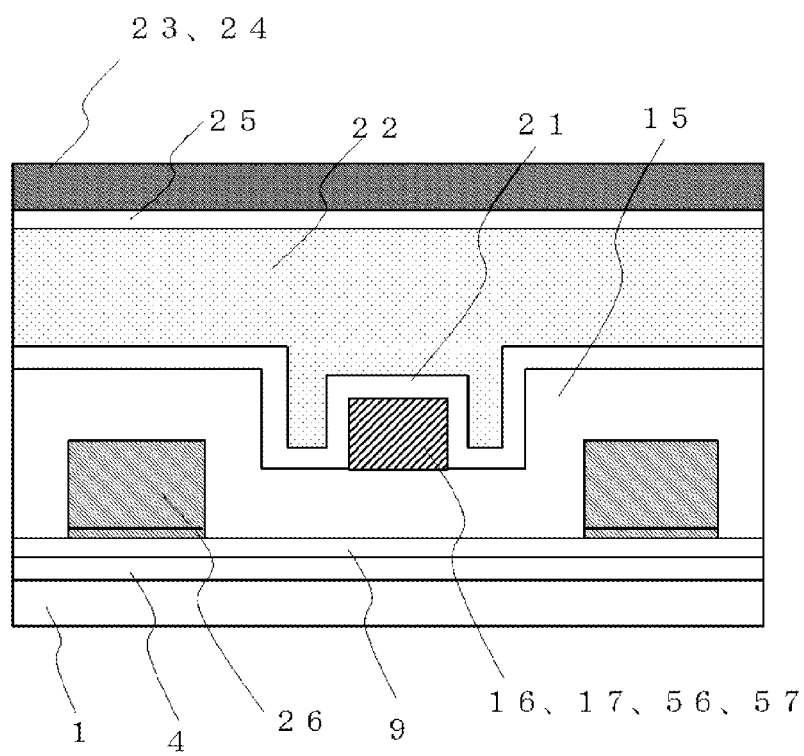
FIG. 10 is a sectional view taken along a line X-X of FIG. 9.

In a fourth illustrative embodiment, a pattern of an amorphous silicon layer configuring a photosensor is arranged between the external data lines 56 (external bias lines 57). FIG. 9 is a plan view illustrating a periphery part of an array substrate of an image detector according to a fourth illustrative embodiment of this disclosure. FIG. 10 is a sectional view taken along a line X-X of FIG. 9. In the below, the image detector of the fourth illustrative embodiment is described with reference to FIGS. 9 and 10.

The data line 16 extending from the pixel part 50 is connected to the terminal pad 19. In FIG. 10, the external data line 56 is formed on the interlayer insulation film 15 that is formed on the insulation substrate 1.

In the meantime, in FIG. 9, a Si-island 26 is formed between the external data line 56 and the neighboring external data line 56. In FIG. 10, the Si-island 26 is formed on the interlayer insulation film 9. The Si-island 26 is formed by the simultaneous patterning on the same layer as the photosensor 100 and lower electrode 10 in the pixel part 50.

Above the Si-island 26, the adhesion area 24 of the conductive cover 23 is positioned via the interlayer insulation film 15 and the planarization film 22 on the interlayer insulation film 21. In the meantime, the conductive cover 23 is fixed on the planarization film 22 via the adhesive 25.

Here, when a pressure is applied to fix the conductive cover 23, the conductive cover is brought into contact with the interlayer film on the hard Si-island 26 before it is contacted to the external data line 56 or external bias line 57 and is thus shorted. Therefore, the short between the conductive cover 23 and the external data line 56 or external bias line 57 is suppressed.

Meanwhile, in FIGS. 9 and 10, the Si-island 26 is arranged for each neighboring wiring. However, an interval of the arrangement is set within a range in which the conductive cover is not brought into contact with the external data line 56 or external bias line 57.

In this illustrative embodiment, a thickness of each film is here schematically provided as follows. A thickness of the bias line 17 (data line 16) is about 1.0 µm and a thickness of the Si-island 26 is about 1.5 µm, so that the Si-island 26 is higher by about 0.5 µm.

The illustrative embodiments may be appropriately combined. Regarding the data line and the bias line, the different illustrative embodiments may be applied. For example, the first and fourth illustrative embodiments, the second and fourth illustrative embodiments and the third and fourth illustrative embodiments may be combined.

Also, when the desired adhesive force is not obtained with the compatibility between the adhesive 25 and the planarization film 22 below the conductive cover 23, the planarization film 22 in the adhesion area 24 of the conductive cover may be removed and an adhesion configuration with the inorganic insulation film may be applied.

Fifth Illustrative Embodiment

Figure 11:
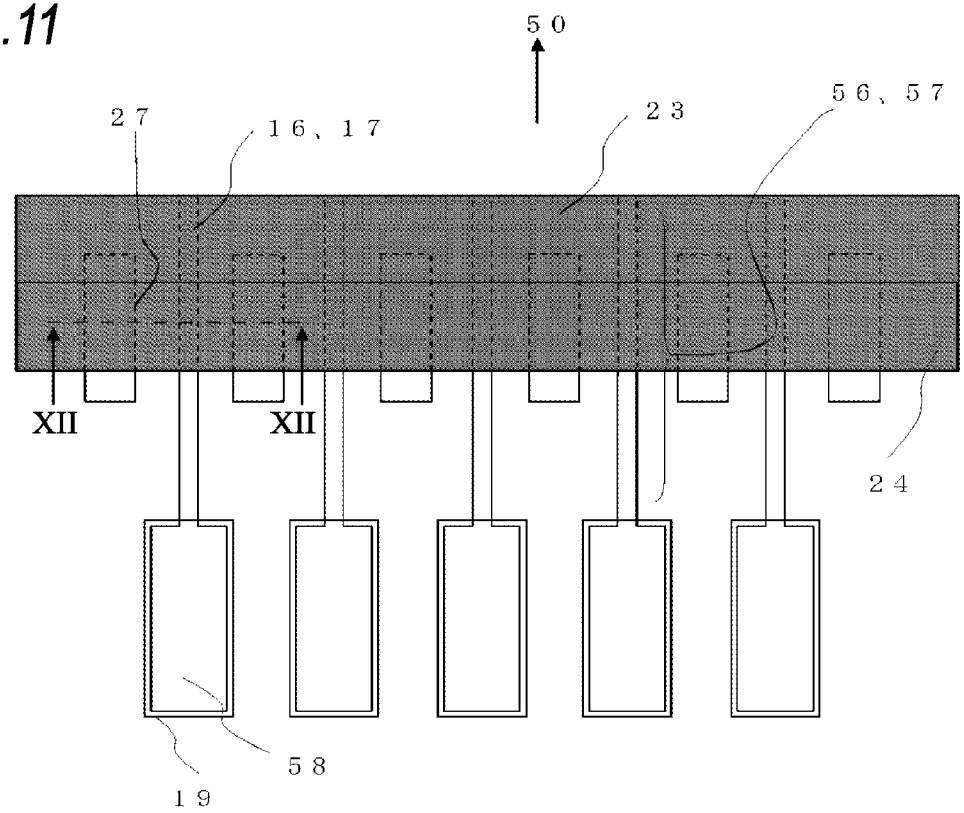
FIG. 11 is a plan view illustrating a periphery part of an array substrate of an image detector according to a fifth illustrative embodiment of this disclosure.
Figure 12:
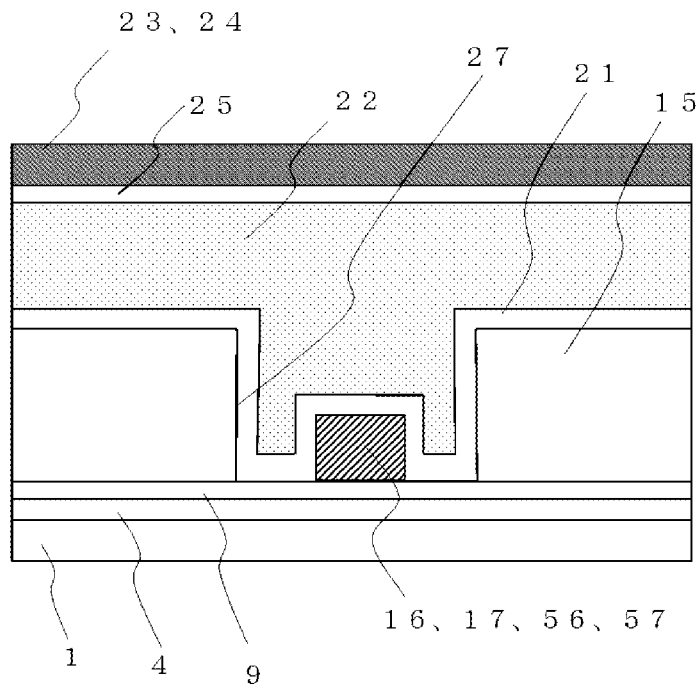
FIG. 12 is a sectional view taken along a line XII-XII of FIG. 11.

In a fifth illustrative embodiment, the interlayer insulation film 15 that is positioned below the external data line 56 or external bias line 57 is removed. FIG. 11 is a plan view illustrating a periphery part of an array substrate of an image detector according to the fifth illustrative embodiment of this disclosure. FIG. 12 is a sectional view taken along a line XII-XII of FIG. 11. In the below, the image detector according to the fifth illustrative embodiment is described with reference to FIGS. 11 and 12.

In FIG. 12, the interlayer insulation film 15 is formed with a recess portion 27. In FIG. 11, the recess portion 27 is formed so that it is positioned below the adhesion area 24 in which the conductive cover 23 contacts the array substrate. The external data line 56 or external bias line 57 is formed in the recess portion 27. Here, a height of an upper surface of the external data line 56 or external bias line 57 is lower than that of the interlayer insulation film 15 except for the recess portion 27.

Here, when a pressure is applied to fix the conductive cover 23, the conductive cover is brought into contact with the interlayer insulation film 15 except for the recess portion 27 before it is contacted to the external data line 56 or external bias line 57 and is thus shorted. Therefore, the short between the conductive cover 23 and the external data line 56 or external bias line 57 is suppressed.

Meanwhile, in FIG. 12, the interlayer insulation film 15 is removed so as to form the recess portion 27. However, the interlayer insulation film 9 below the interlayer insulation film 15 may be also removed. Also, the gate insulation film 4 of the lower layer may be removed. Thereby, a difference between the height of the upper surface of the external data line 56 or external bias line 57 and the height of the interlayer insulation film 15 except for the recess portion 27 is increased, so that it is possible to increase the thickness of the external data line 56 or external bias line 57 and to further reduce the short.

Also, in FIG. 12, a side surface of the recess portion 27 is perpendicular to the substrate surface. However, the recess portion 27 may be formed so that a gentle taper is made. That is, a taper shape may be processed in which an opening area of the recess portion 27 is increased as it gets away from the substrate surface. Also, the fifth illustrative embodiment may be appropriately combined with the first to fourth illustrative embodiments.

Figure 13:
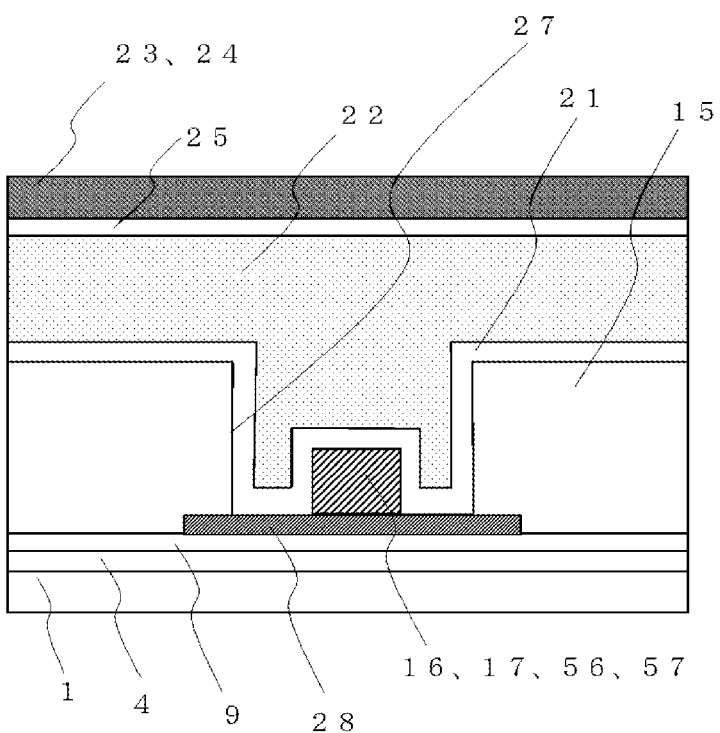
FIG. 13 is a plan view illustrating a periphery part of an array substrate of an image detector according to another example of the fifth illustrative embodiment of this disclosure.

Subsequently, another example of the fifth illustrative embodiment is described with reference to FIG. 13 that is a sectional view taken along a line XII-XII of FIG. 11. In FIG. 13, a conductive layer 28 is provided below the external data line 56 or external bias line 57 formed in the recess portion 27. The conductive layer 28 is configured by a film of the same layer as the lower electrode 10 and is formed on the interlayer insulation film 9.

In this illustrative embodiment, the conductive layer 28 is provided below the external data line 56 or external bias line 57. Therefore, when removing the interlayer insulation film 15 so as to form the recess portion 27, it is possible to suppress even the interlayer insulation film 9 or gate insulation film 4 from being removed. That is, the conductive layer 28 provided below the external data line 56 or external bias line 57 functions as an etching stopper. Meanwhile, the first to fourth illustrative embodiments may be also appropriately combined with the example shown in FIG. 13.

Also, unless otherwise noted in the first to fifth illustrative embodiments of this disclosure, the effects of this disclosure are further improved when this disclosure is applied to both the data line and the bias line. However, the effect of this disclosure is also realized even when this disclosure is applied to any one of the data line and the bias line. In other words, this disclosure can be applied to the at least one of the data line and the bias line.

What is claimed is:

1. An image detector comprising:
an active matrix-type TFT array substrate having a pixel area, in which photoelectric conversion elements and thin film transistors are arranged in a matrix shape, a data line, and a bias line;
a conversion layer, which is arranged on the TFT array substrate and converts radiation into light; and
a conductive cover, which covers the conversion layer,
wherein the thin film transistor comprises: a plurality of gate lines having a gate electrode; a semiconductor layer provided to the gate electrode via a gate insulation film; and a source electrode and a drain electrode connected to the semiconductor layer,
wherein the photoelectric conversion element, which connects with the drain electrode via a first contact hole opened through a first passivation film provided above the thin film transistor,
wherein the data line is formed on a second passivation film provided above the photoelectric conversion element and connects with the source electrode via a second contact hole opened through the first passivation film and the second passivation film,
wherein the bias line is formed on the second passivation film provided above the photoelectric conversion element and connects with the photoelectric conversion element via a third contact hole opened through the second passivation film,
wherein the TFT array substrate comprises: a gate terminal to input a driving signal to the gate electrode from an outside; a data terminal to read out charges detected in the photoelectric conversion element to the outside via the data line; and a bias terminal to input an applied voltage from the outside to the photoelectric conversion element via the bias line,
wherein the conductive cover is adhered in an adhesion area in an upper layer than an area, in which at least one of the data line and the bias line extend from the pixel area to each of the terminals, and
wherein inorganic insulation films configured by at least two layers are formed between the at least one of the data line and the bias line and the adhesion area.

2. The image detector according to claim 1,
wherein at least one of the first passivation film and the second passivation film are removed to form a recess portion below the adhesion area of the conductive cover, and
wherein the at least one of the data line and the bias line are formed in the recess portion.

* * * * *